United States Patent [19]

Wang

[11] Patent Number: 5,037,766
[45] Date of Patent: Aug. 6, 1991

[54] METHOD OF FABRICATING A THIN FILM POLYSILICON THIN FILM TRANSISTOR OR RESISTOR

[75] Inventor: Ting S. Wang, Hsin-chu, Taiwan

[73] Assignee: Industrial Technology Research Institute, Hsinchu, Taiwan

[21] Appl. No.: 466,583

[22] Filed: Jan. 17, 1990

Related U.S. Application Data

[62] Division of Ser. No. 280,646, Dec. 6, 1988, abandoned.

[51] Int. Cl.⁵ .................. H01L 21/265; H01L 21/28; H01L 21/336
[52] U.S. Cl. ........................... 437/24; 437/46; 437/233; 437/918; 357/23.7; 357/52; 148/DIG. 136
[58] Field of Search ............... 437/24, 46, 40, 41, 437/233, 918; 148/DIG. 136; 357/23.7, 52

[56] References Cited

U.S. PATENT DOCUMENTS

| | | | |
|---|---|---|---|
| 4,332,075 | 6/1982 | Ota et al. | 437/40 |
| 4,398,340 | 8/1983 | Brown | 437/40 |
| 4,406,051 | 9/1983 | Lizuka | 437/24 |
| 4,502,204 | 3/1985 | Togashi et al. | 437/40 |
| 4,539,743 | 9/1985 | Anthony et al. | 437/24 |
| 4,545,824 | 10/1985 | Salvi et al. | 437/24 |
| 4,575,923 | 3/1986 | Arnold | 437/918 |
| 4,682,407 | 7/1987 | Wilson et al. | 437/24 |
| 4,702,937 | 10/1987 | Yamoto et al. | 437/233 |
| 4,740,481 | 4/1988 | Wilson et al. | 437/24 |
| 4,762,801 | 8/1988 | Kapoor | 437/24 |
| 4,772,927 | 9/1988 | Saito et al. | 437/24 |
| 4,849,248 | 7/1989 | Hashimoto | 437/918 |
| 4,851,359 | 7/1989 | Boudou et al. | 437/24 |
| 4,885,257 | 12/1989 | Matsushita | 437/24 |
| 4,891,332 | 1/1990 | Bloem et al. | 437/24 |
| 4,897,368 | 1/1990 | Kobushi et al. | 437/24 |
| 4,916,507 | 4/1990 | Boudou et al. | 437/24 |
| 4,931,405 | 6/1990 | Kamijo et al. | 437/24 |
| 4,954,454 | 9/1990 | Kobushi et al. | 437/24 |

FOREIGN PATENT DOCUMENTS

| | | | |
|---|---|---|---|
| 0116702 | 8/1984 | European Pat. Off. | 437/918 |
| 0037690 | 3/1979 | Japan | 437/918 |
| 0082458 | 6/1980 | Japan | 437/918 |
| 0162786 | 8/1985 | Japan | 437/918 |
| 0052471 | 10/1988 | Japan | 437/918 |
| 0069033 | 3/1989 | Japan | 437/918 |
| 0261818 | 10/1989 | Japan | 437/24 |
| 0268047 | 10/1989 | Japan | 437/918 |
| 2182488 | 5/1987 | United Kingdom | 437/918 |

OTHER PUBLICATIONS

Sze, *Physics of Semiconductor Devices*, John Wiley and Sons, 1969, pp. 568–586.

*Primary Examiner*—Olik Chaudhuri
*Assistant Examiner*—M. Wilczewski
*Attorney, Agent, or Firm*—Hung Chang Lin

[57] ABSTRACT

A method of fabricating a double layered polisilicon film with oxygen diffusion for scaled down polysilicon thin film transistor/resistor. The double layered polysilicon film structure includes: a first heavily doped polysilicon layer, produced by Low Pressure Chemical Vapor Deposition (LPCVD) system at about 610 degrees Centigrade, is used as electrodes of resistor or source/drain electrodes of a transistor, and a second layer of polysilicon, deposited by LPCVD at the temperature about 560 degrees Centigrade, is used as a resistor layer or a channel layer of a transistor.

Oxygen treatment is applied at low temperature after the first polysilicon layer is defined. The oxygen present at polysilicon grain boundary blocks the dopant diffusing from the first electrode polysilicon to the second polysilicon which is used as resistor region or a channel region of a transistor. Thus, the resistor can maintain high resistivity and the transistor can maintain low threshold voltage even when they are scaled down.

9 Claims, 3 Drawing Sheets

GATE ELECTRODE 15
GATE INSULATOR 14
INTRINSIC POLYSILICON 12
HIGHLY DOPED POLYSILICON 11
SUBSTRATE 3

INTRINSIC POLYSILICON 2
SUBSTRATE 3

METHOD OF FABRICATING A THIN FILM POLYSILICON THIN FILM TRANSISTOR OR RESISTOR

This application is a division of application Ser. No. 07/280,646 filed Dec. 6, 1988, now abandoned.

BACKGROUND OF THE INVENTION

Highly resistive polysilicon is essential for static RAMs with high packing density and low powder dissipation, but the high dopant diffusion coefficient in polysilicon grain boundary limits the minimum length of the polysilicon thin film resistor to be scaled down. In the coventional technique, as depicted by R. Sakto, et al in "A Novel Scaled Down Oxygen Implanted Polysilicon Resistor for Future Static RAMs" published in the 1986 IEEE International Electron Devices Meeting Proceedings, the scaling down of resistors can be realized by using oxygen as an implantation source. When oxygen is implanted into polysilicon layer, the dopant (such as arsenic) diffusing speed in the polysilicon grain boundary drastically decreases after high temperature treatment, as described by T. Ohzone et al in an article entitled, "Ion-Implanted Thin Polycrystalline Silicon High-Value Resistors for High Density Poly-Load Static RAM Applications", in the IEEE Transactions on Electron Device, Vol. ED-32, September 1985, pp. 1749-1755.

Nowadays, polysilicon thin film transistor has received a great deal of attention for its application for high packing density three-dimension integrated circuit, as described by T. Ohzone, et al in "An 8K × 8 Bit Static MOS RAM Fabricated by n-MOS/n-well CMOS Technology" in the IEEE Journal of Solid State Circuits, Vol. SC-15. October 1980, pp. 854-861. For high packing density and high speed operation of three-dimension integrated circuits, the size of polysilicon thin film transistor must be scaled down and the threshold voltage must be kept as low as possible. The oxygen implantation method to scale down the size of polysilicon thin film resistor described by T. Ohzone cannot be used to scale down the size of polysilicon thin film transistor, because this method increases the threshold voltage of the polysilicon thin film transistor. As a result, additional lithographic processes are needed to mask the transistor region while implanting with oxygen the resistor region on the polysilicon thin film.

SUMMARY OF THE INVENTION

The object of the present invention is to eliminate the dopant lateral diffusion along the grain boundary from a highly doped region to the undoped intrinsic region. Another object of this invention is to enable the scaling down of the dimensions of thin film polysilicon resistors and transistors. Also an object of the present invention is to decrease the threshold voltage of a thin film field effect transistor. Still another object of the present invention is to fabricate the polysilicon thin film resistor and thin film transistor on the same layer without further lithographic processes.

These objects are achieved in the present invention by treating the highly doped region with oxygen, which blocks the out-diffusion of the dopant from the highly doped region to the undoped region. In the present invention, a double layered polysilicon structure is used. One layer is a highly doped layer which is used as an electrodes; the other is an intrinsic layer, used as the resistor layer or the channel layer of a MOS transistor. Oxygen treatment is applied at low temperature after the first highly doped polysilicon electrode is defined, and before the second layer is deposited. The oxygen then diffuses into the surface and grain boundary of the first highly doped polysilicon and blocks the lateral diffusion of the dopant from the first highly doped polysilicon to the second intrinsic polysilicon during subsequent high temperature process. Then, the second polysilicon, free from oxygen, can be used as a high resistivity resistor or a channel layer in a thin film transistor without incurring high threshold voltage.

The objects and features of the present invention become more apparent with reference to the following description and drawings.

DESCRIPTION OF THE PREFERRED EMBODIMENT

Figure 1:
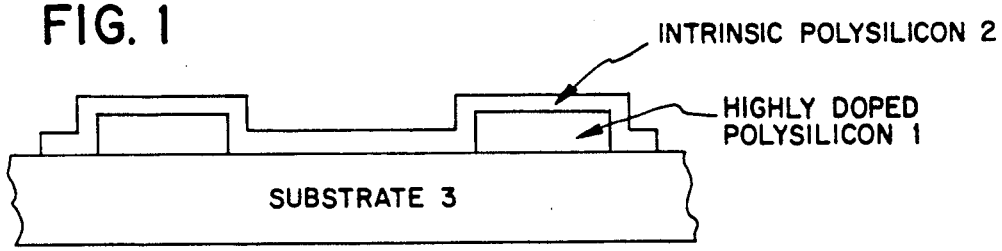
FIG. 1 is the cross section view of the double polysilicon thin film resistor to which this invention applies.

In FIG. 1, the cross section of a double layered polysilicon thin film resistor is shown. A highly doped layer 1 is doped by arsenic (As) or phosphorus (P), and is used as an electrode of a resistor. A second polysilicon layer 2 is of intrinsic type and is used as a highly resistive resistor. A substrate 3 can be any kind of insulator. The highly doped polysilicon 1 is defined before the undoped intrinsic polysilicon layer 2 is deposited.

Figure 2:
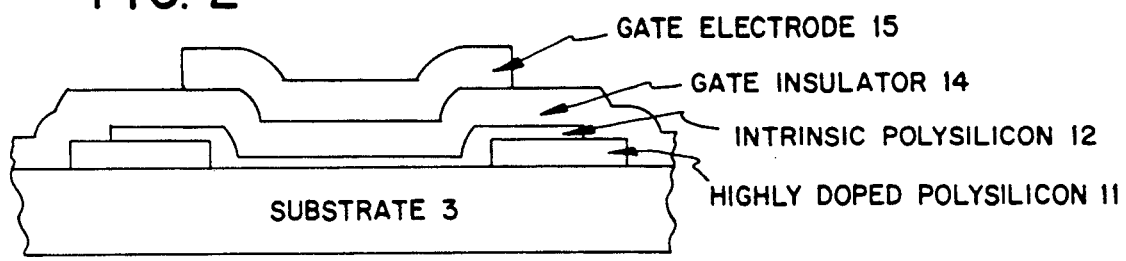
FIG. 2 is the cross section view of the double polysilicon thin film transistor to which this invention applies.

In FIG. 2, the cross section of a double layered polysilicon thin film transistor is shown. A highly doped polysilicon layer 11, similar to layer 1 in FIG. 1, is used as a source/drain electrode of a transistor. The channel region is formed by the undoped intrinsic polysilicon layer 12 similar to the resistor 2 layer in FIG. 1. Then a gate insulator layer 14 is deposited, and a gate electrode 15, which is a conductive layer, is deposited and defined.

Figure 3A:
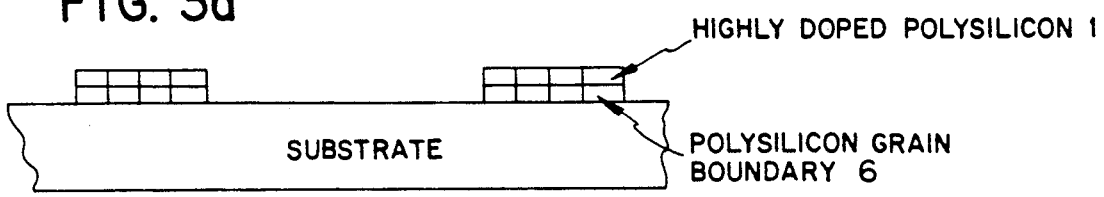
FIG. 3 is the process flow of a double polysilicon structure and the mechanism of oxygen treatment according to this invention.
 a). after first polysilicon deposition and patterning;
 b). after oxygen treatment;
 c). after second polysilicon deposition.
Figure 3B:
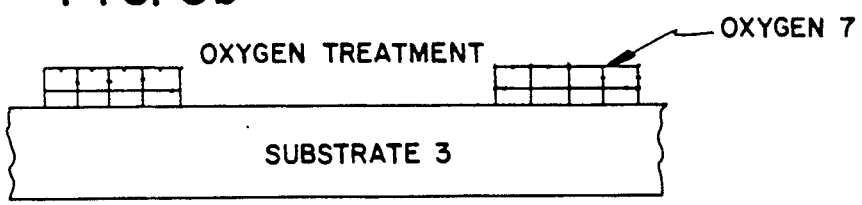
Figure 3C:
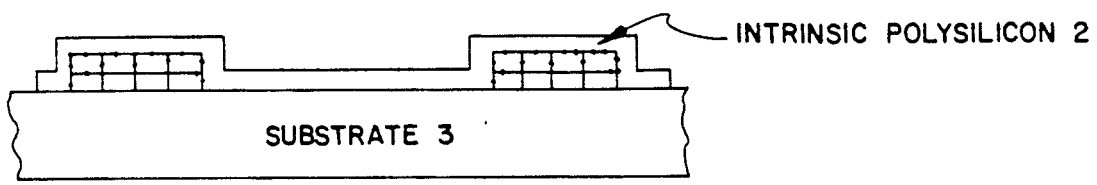
Figure 4:
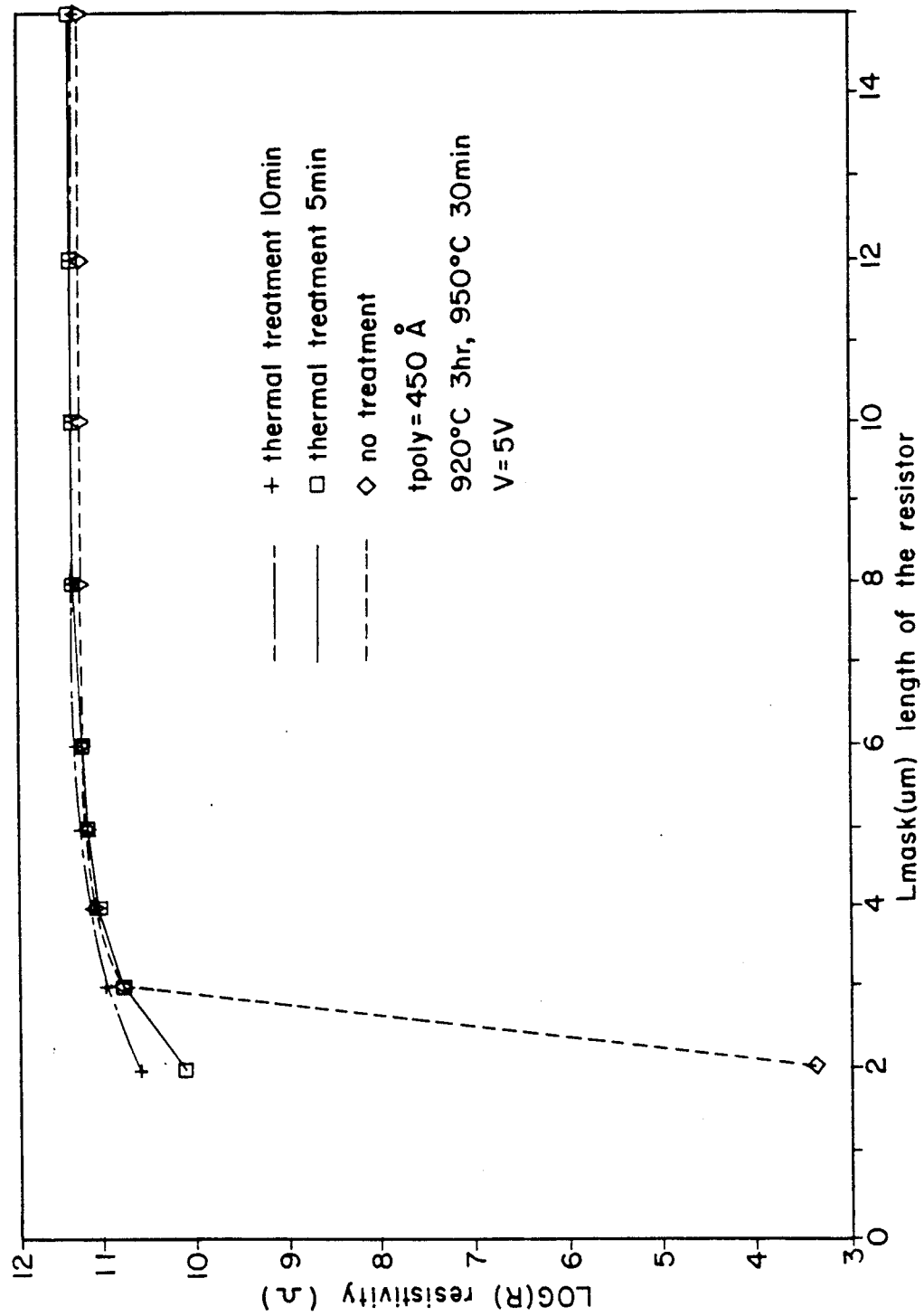
FIG. 4 is a plot of the resistivity versus the length of the resistor, showing that resistivity of short length resistor is not degraded for long oxygen treatment time.

The method of scaling down the dimension of the thin film resistor in FIG. 1 and the thin film transistor in FIG. 2 is described in FIG. 3. Referring to FIG. 1, after the highly doped polysilicon 1 is defined, an oxygen treatment is performed at low temperature (400° C.) for 5 to 10 minutes. The oxygen diffuses into the surface and the grain boundaries, depicted as grids 6 of polysilicon 1, to block the doped atoms from diffusing from the highly doped polysilicon 1 into the intrinsic polysilicon 2 through the grain boundaries 6. The oxygen molecules are lodged along the grain boundaries as depicted by dots in FIG. 3(b). Afterwards, when the second polysilicon layer is deposited, the oxygen molecules remain in place as depicted in FIG. 3(c). The effect of oxygen treatment on resistor resistivity (defined as resistance per unit length) is shown in FIG. 4. It shows the relationship between resistivity and mask length of the resistor with oxygen treatment time as running parameter. Note that the resistivity of short length resistors drops sharply as oxygen treatment time is decreased for short mask length.

Figure 5:
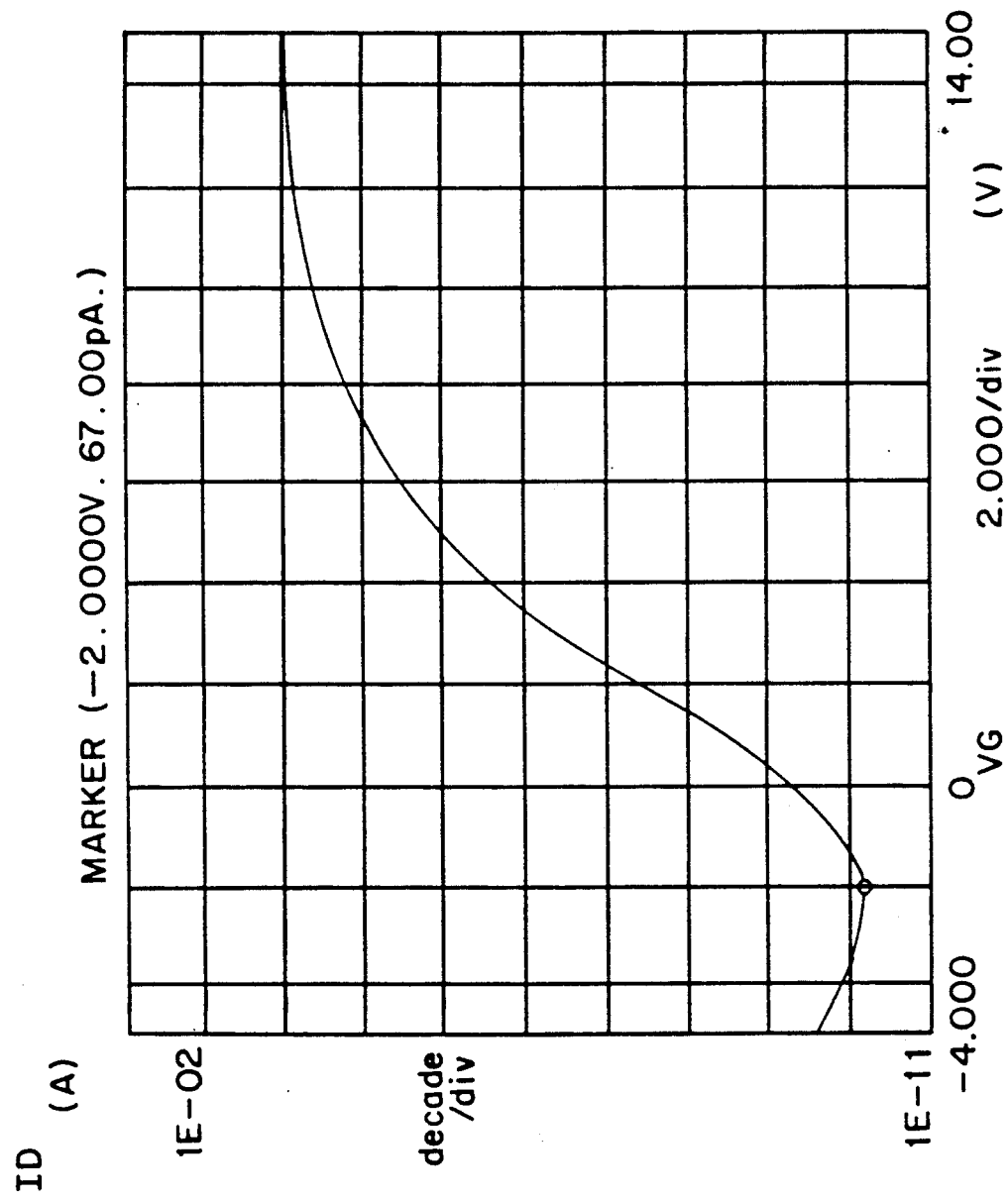
FIG. 5 is the drain current versus gate voltage characteristics of a thin film transistor processed according to the present invention.

In the transistor application shown in FIG. 2, oxygen treatment only affects the doped polysilicon layer 11, while the undoped intrinsic polysilicon 12 is kept intact. The characteristics of a thin film transistor fabricated according to this invention is shown in FIG. 5. The transistor has a width of 50 micrometers, a length of 2 micrometers, and a channel layer thickness of 80 nanometers. The gate insulator has two layers; 350 Angstroms of silicon dioxide ($SiO_2$) underneath and 300 Angstroms of silicon nitride ($Si_3N_4$) on top. FIG. 5 is a plot of drain current ($I_D$) versus gate voltage ($V_{GS}$). Note that $I_D$ drops off sharply at about 4 volts. This voltage is then the threshold voltage, and is a reasonable value. If there were no oxygen treatment, the threshold voltage would be degraded to a very high value due to encroachment of the dopant from the drain and source into the channel region. Thus, the oxygen treatment of this invention has overcome the degradation problem of a short channel thin film MOS transistor.

While the foregoing description is based on oxygen treatment to create a diffusion blocking region, it is conceivable that other means, such as nitrogen treatment, may also achieve the same result. This invention is by no means limited to an oxygen treatment.

What is claimed is:

1. A method of fabricating a semiconductor thin film structure having polycrystalline semiconductor first and second layers, comprising the steps of: depositing said first layer on an insulating substrate; heavily doping said first layer; selectively removing said first layer except electrode regions of said structure; subjecting said first layer to a gas treatment, said gas capable of reacting with grain boundary surfaces of said first layer to form a diffusion blocking region in said first layer and to retard out-diffusion of dopant from said first layer; depositing said second layer, undoped and not subjecting to said gas treatment; and heating said structure for making electrical contact between the two said layers.

2. A method of fabricating a semiconductor thin film structure as described in claim 1, wherein said gas is oxygen.

3. A method of fabricating a semiconductor thin film structure as described in claim 2, wherein said oxygen is applied after said first layer has been doped.

4. A method of fabricating a semiconductor thin film structure as described in claim 2, wherein said oxygen treatment is obtained with dilute oxygen at temperatures ranging from 400° C. to 500° C.

5. A method of fabricating a semiconductor thin film structure as described in claim 1, wherein said gas is nitrogen.

6. A method of fabricating semiconductor thin film structure as described in claim 1, wherein said second layer has a high resistivity resistance, and said electrode regions serve as contact electrodes.

7. A method of fabricating a semiconductor thin film structure as described in claim 1, wherein said semiconductor is silicon.

8. A method of fabricating a semiconductor thin film structure as described in claim 1, wherein said dopant for said first layer is arsenic, phosphorus or boron.

9. A method of fabricating a semiconductor thin film structure as described in claim 1, wherein said second layer serves as a channel of a thin film field effect transistor, said channel having an insulated gate as control electrode, and said electrode regions serve as source and drain of said transistor.

* * * * *